United States Patent [19]

Ameurlaine et al.

[11] 3,845,494

[45] Oct. 29, 1974

[54] HGTE-CDTE PHOTOVOLTAIC DETECTORS

[75] Inventors: Jacques François Ameurlaine; Gérard David Cohen-Solal, both of Paris, France

[73] Assignee: Societe Anonyme de Telecommunications, Paris, France

[22] Filed: Jan. 12, 1973

[21] Appl. No.: 323,222

[30] Foreign Application Priority Data

Jan. 27, 1972 France .............................. 72.02654

[52] U.S. Cl. ...................................... 357/30, 136/89

[51] Int. Cl...... H01l 11/00, H01l 15/00, H01l 15/02

[58] Field of Search...... 317/235 N; 250/212, 211 J; 252/62.3 ZT; 136/89

[56] References Cited

UNITED STATES PATENTS

| | | | |
|---|---|---|---|
| 3,218,203 | 11/1965 | Ruehrwein | 317/235 N |
| 3,411,050 | 11/1968 | Middleton et al. | 317/235 N |
| 3,437,527 | 4/1969 | Webb | 317/235 N |
| 3,539,883 | 11/1970 | Harrison | 317/235 N |

OTHER PUBLICATIONS

Verie, C. and J., J. "Cd Hg _ Te Infrared Photovoltaic Detectors," Applied Physics Letters, Vol. 10, No. 9, May 1, 1967, pp. 241–243.

Kohn, A. N., "1–2 Micron (HgCd)Te Photodetectors" IEEE, Trans. On Electron Devices, Vol. ED–16, No. 10, October 1969, page 885.

*Primary Examiner*—James W. Lawrence
*Assistant Examiner*—T. N. Grigsby

[57] ABSTRACT

An HgTe-CdTe photovoltaic detector comprising an HgTe-CdTe semiconductor plate having two different doped regions separated by a junction, wherein said plate is coated, at least on the free faces of the plate, with a continuous film of a material which is impervious to mercury and does not effect, or possibly even enhances, the detecting properties of the crystals constituting the detector.

6 Claims, 2 Drawing Figures

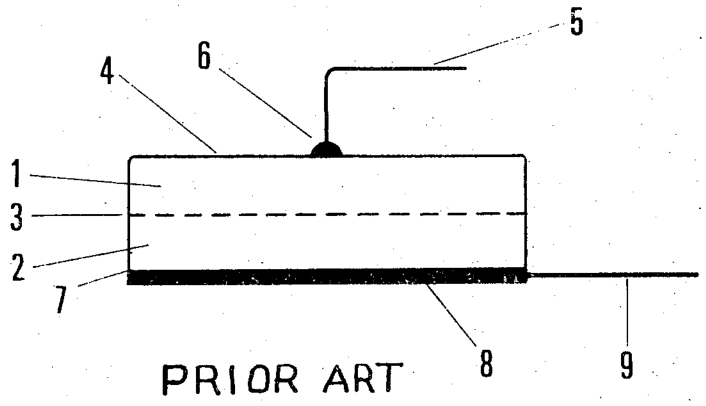
. Fig. 1 .
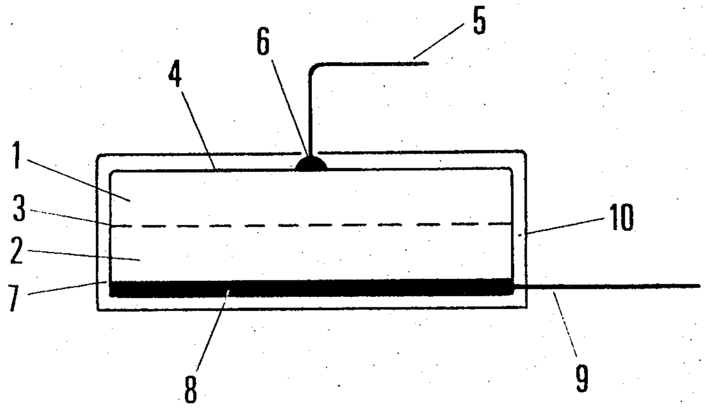
. Fig. 2 .

HGTE-CDTE PHOTOVOLTAIC DETECTORS

The present invention relates to HgTe-CdTe photovoltaic detectors or cells.

Such detectors comprise a plate of the HgTe-CdTe semi-conductor having two different doped regions: a region *p* and a region *n*, these two regions being separated by a junction. Each of these regions carries an output connection or electrode. The presence of a radiation, for example an infra-red radiation impinging on either of the faces *n* or *p*, produces between the two electrodes a difference of potential whose magnitude depends on the intensity of the infra-red radiation and the quality of the HgTe-CdTe photovoltaic detector.

Good quality of such an HgTe-CdTe photovoltaic detector is achieved for a well-determined proportion of the electronic concentrations of the *n* and *p* regions of the detector. As these *n* and *p* regions are obtained by heat treatment in a controlled atmosphere of mercury, it will be clear that any evaporation of mercury from the detector deteriorates the latter. Now, such evaporation is often produced by the conditions surrounding the detector in the course of use. Especially in the case of spatial utilisations, temperature variations together with pressure variations result in a marked release of mercury.

By artificially creating such conditions of utilisation said release of mercury was revealed by a mass spectrometer. Such a release of mercury is practically of no importance in respect of HgTe-CdTe photoconductor detectors in which it is manifested simply by a slight drop in the sensitivity of the detectors, but this is not so in the case of photovoltaic detectors in which the junction, the function of which is of prime importance, is rapidly deteriorated by this release of mercury.

In order to avoid this drawback, the HgTe-CdTe photovoltaic detector according to the invention is coated on at least its free faces with a continuous film of a material which is impervious to mercury and does not modify or possibly even enhances, the detecting properties of the crystals of the detector.

Thus, according to the invention, the coating layer will have first of all such optical, mechanical and electrical properties that it does not affect the detecting properties of the detecting crystals such as those presently known. Thus, in the case of infra-red radiation, the material constituting this layer will have to be transparent to infra-red radiations of wavelengths between 8 and 12 microns and further within this range of wavelengths its index of refraction will be advantageously lower than or equal to 3 so that this layer has an anti-reflection effect.

Further, from the electrical point of view, the material of said coating layer must have a high electrical resistivity so that the resistance it affords in parallel at the junction is of high magnitude. The material of said layer will also have such properties that its strength and chemical resistance are such that they are unaltered in course of time by the action of exterior agents. The physical and chemical affinities of said material will have to permit moreover a perfect coating of the photovoltaic detector, which coating will have to be carried out in operations which do not tend to destroy the detecting properties of the HgTe-CdTe material obtained.

The combination of all these rules of selection permits drawing up a non-limitative list of some satisfactory materials among which are in particular preferred, according to the invention, those which permit the inhibition of the diffusion of the mercury in the direction from the HgTe-CdTe material to the surrounding medium.

By way of a non-limitative example, there is employed as the material of the coating layer zinc sulphide, zinc selenide or arsenic pentaselenide.

Any other material satisfying the rules of selection mentioned hereinbefore is of utility for the coating layer of HgTe-CdTe photovoltaic cells according to the invention. According to the invention, it is not excluded that the coating layer be non-uniform. In particular, the part of the coating layer in contact with the sensitive surface of the detector and the part of the coating layer in contact with the *n–p* junction region of the detector may be of different natures.

The improvement brought by the present invention ensures a higher stability of the HgTe-CdTe photovoltaic detectors by reduction of the losses of mercury liable to occur under certain surrounding conditions, and thus permits the utilisation of these detectors in spatial applications in respect of which the conditions of utilisation and the extremely high reliability required heretofore limited their use.

Further, the materials employed for the coating layer according to the invention are mostly impervious to both mercury and cadmium so that, in opposing evaporation of mercury, they also oppose evaporation of cadmium.

A better understanding of the invention will be had from the ensuing description with reference to the accompanying drawing in which:

FIG. 1 is a sectional view of an HgTe-CdTe photovoltaic dector and

FIG. 2 is a similar view with the detector coated according to the invention.

The illustrated HgTe-CdTe photovoltaic detector comprises a crystal of known type having a *n* doped region 1 and a *p* doped region 2, the interface of which forms the actual junction 3. The upper face 4 of the *n* doped region is the sensitive face of the detector. An electrode 5 is secured to the centre of this face by a gold solder spot 6. The lower face 7 of the *p* region is entirely covered by a deposit of gold 8 to which the second electrode 9 of the photovoltaic detector is connected. A difference of potential is created between the electrodes 5 and 9 under the effect of infra-red radiation impinging on the face 4.

A thin layer 10 of a material impervious to mercury and having the required physical, chemical and electrical properties completely coats the HgTe-CdTe unit 1 and 2 and the solders 6 and 8, it allowing the electrodes 5 and 9 to extend out of the layer. The layer 10 may be, for example, of zinc sulphide. Apart from the fact that zinc sulphide is a material which satisfies all the required conditions for constituting the coating layer according to the invention, the utilisation of zinc sulphide permits the application to the construction of the photovoltaic detectors according to the invention of the well known technique of the deposition of a thin layer of zinc sulphide by evaporation in a vacuum or by cathodic spraying.

The particular arrangement of the illustrated HgTe-CdTe detector is given solely by way of a non-limitative example, it being understood that the improvement according to the invention is also applicable to any other arrangement of a HgTe-CdTe photovoltaic detector. In particular, when the HgTe-CdTe detector crystal is fixed by one of its faces to a support in a non-detachable manner, the coating layer may be deposited solely on the other faces of the crystal which are not protected by the support after the detector has been fixed to its support, for example by adhesion.

What we claim is:

1. An HgTe-CdTe photovoltaic detector comprising an HgTe-CdTe semiconductor plate having two different doped regions separated by a junction, said plate being completely coated with a continuous film of a metallic sulphide or selenide for preventing outward diffusion of mercury vapor from said plate.

2. A photovoltaic detector according to claim 1, wherein the coating film is at least partly constituted by zinc sulphide.

3. A photovoltaic detector according to claim 1, wherein the coating film is at least partly constituted by zinc selenide.

4. A photovoltaic detector according to claim 1, wherein the coating film is at least partly constituted by arsenic pentaselenide.

5. A photovoltaic detector according to claim 1, wherein the semi-conductor plate comprises an upper *n* doped region and a lower *p* doped region superimposed to form an interface junction, the upper face of the *n* doped region being the sensitive detector face, an electrode extending from the center of the upper face and spot-soldered thereto with gold, the lower face of the *p* doped region being entirely covered with gold to which an electrode is connected, a difference of potential being created between the electrodes under the effect of infrared radiation impinging on said upper face, and said plate being completely coated with a continuous film of a metallic sulphide or selenide for preventing outward diffusion of mercury vapor from said plate.

6. In a HgTe-CdTe photovoltaic detector comprising an HgTe-CdTe semiconductor plate having two different doped regions separated by a junction, said plate being completely coated with a continuous layer of at least one compound of the group consisting of zinc sulphide, zinc selenide and arsenic pentaselenide for preventing outward diffusion of mercury vapor from said plate.

* * * * *